(12) United States Patent
Nikitin et al.

(10) Patent No.: US 8,828,804 B2
(45) Date of Patent: Sep. 9, 2014

(54) SEMICONDUCTOR DEVICE AND METHOD

(75) Inventors: Ivan Nikitin, Regensburg (DE);
Alexander Heinrich, Regensburg (DE);
Stefan Landau, Wehrheim (DE)

(73) Assignee: Infineon Technologies AG, Neubiberg (DE)

( * ) Notice: Subject to any disclaimer, the term of this patent is extended or adjusted under 35 U.S.C. 154(b) by 1091 days.

(21) Appl. No.: 12/112,807

(22) Filed: Apr. 30, 2008

(65) Prior Publication Data
US 2009/0273066 A1    Nov. 5, 2009

(51) Int. Cl.
*H01L 21/00*    (2006.01)

(52) U.S. Cl.
USPC ........... 438/119; 438/113; 438/123; 257/676; 257/E21.514; 257/E29.061

(58) Field of Classification Search
CPC ............ H01L 21/76898; H01L 23/481; H01L 25/0657; H01L 25/50
USPC ................. 438/113, 118, 119, 123, 460, 464; 257/676, E21.514, E29.061
See application file for complete search history.

(56) References Cited

U.S. PATENT DOCUMENTS

| 5,316,853 | A | 5/1994 | Shibata et al. |
| 5,786,633 | A | 7/1998 | Wolfgang et al. |
| 6,507,105 | B1 | 1/2003 | Yamagata et al. |
| 6,518,097 | B1 * | 2/2003 | Yim et al. ..................... 438/119 |
| 6,727,117 | B1 | 4/2004 | McCoy |
| 7,083,850 | B2 | 8/2006 | Rasiah |
| 2003/0146497 | A1 | 8/2003 | Abbott et al. |
| 2004/0080055 | A1 * | 4/2004 | Jiang ............................. 257/783 |
| 2004/0140549 | A1 * | 7/2004 | Miyagawa .................... 257/700 |
| 2007/0001313 | A1 * | 1/2007 | Fujimoto et al. .............. 257/778 |
| 2007/0025684 | A1 | 2/2007 | Otremba |
| 2007/0057357 | A1 * | 3/2007 | Chen ............................. 257/686 |
| 2007/0181987 | A1 | 8/2007 | Hong et al. |

FOREIGN PATENT DOCUMENTS

DE    10 2006 033 073 B3    2/2008
EP    0 477 600 A1    4/1992

* cited by examiner

*Primary Examiner* — Tuan N. Quach
(74) *Attorney, Agent, or Firm* — Dicke, Billig & Czaja, PLLC

(57) ABSTRACT

An electronic device and fabrication of an electronic device. One embodiment provides applying a paste including electrically conductive particles to a surface of a semiconductor wafer. The semiconductor wafer is singulated with the electrically conductive particles for obtaining a plurality of semiconductor chips. At least one of the plurality of semiconductor chips is placed over a carrier with the electrically conductive particles facing the carrier. The electrically conductive particles are heated until the at least one semiconductor chip adheres to the carrier.

7 Claims, 6 Drawing Sheets

SEMICONDUCTOR DEVICE AND METHOD

BACKGROUND

This invention relates to an electronic device and a method of fabricating an electronic device.

Electronic devices may include carriers on which semiconductor chips may be mounted. Furthermore, electronic devices may include electrically conductive means so as to provide the coupling between the components of the devices, such as the semiconductor chips and the carriers.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
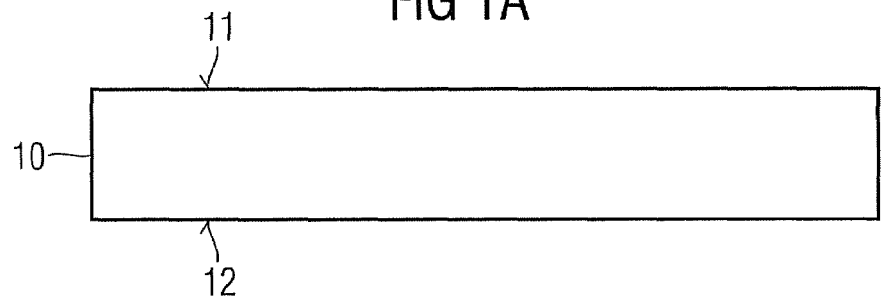
FIGS. 1A to 1D schematically illustrate one embodiment of a method to fabricate a device 100.
Figure 1B:
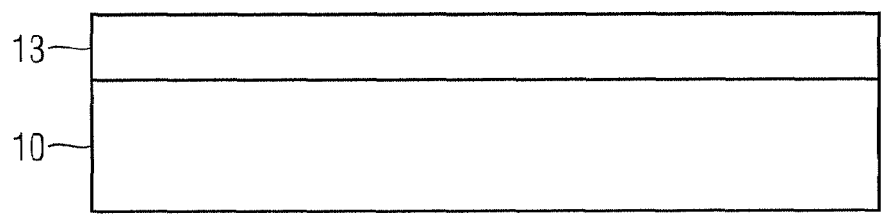

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types and may include for example integrated electrical or electro-optical circuits. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, that is to say on its top side and bottom side. In one embodiment, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips may be fabricated on a wafer made of semiconductor material. The surface area of a semiconductor wafer may be standardized according to predetermined wafer diameters, e.g., 4 inches, 8 inches, 10 inches or 12 inches. The thickness of the semiconductor wafers may vary within ranges of typically 100 to 1000 µm, where these values may also be smaller or larger in specific applications. The semiconductor wafers may be thinned, for example by grinding their backsides, down to a thickness in the range from 30 to 200 µm. The semiconductor wafers may be diced thereby separating the individual semiconductor chips.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be placed on carriers. The carriers may be of any shape, size or material. During the fabrication of the devices the carriers may be connected to each other. The carriers may also be made from one piece. The carriers may be connected among each other by connection means or mechanism with the purpose of separating the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, in one embodiment copper, copper alloys, iron nickel, aluminum, aluminum alloys, or other appropriate materials. The carriers may be, for example, a leadframe or a part of a leadframe. Furthermore, the carriers may be plated with an electrically conductive material, for example copper, silver, iron nickel or nickel phosphorus.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material. The external contact elements may be leads of a leadframe.

The devices may include a mold material covering at least parts of the components of the devices. The mold material may be any appropriate thermoplastic or thermosetting material. Various techniques may be employed to cover the components with the mold material, for example compression molding, injection molding, powder molding or liquid molding.

Figure 1C:
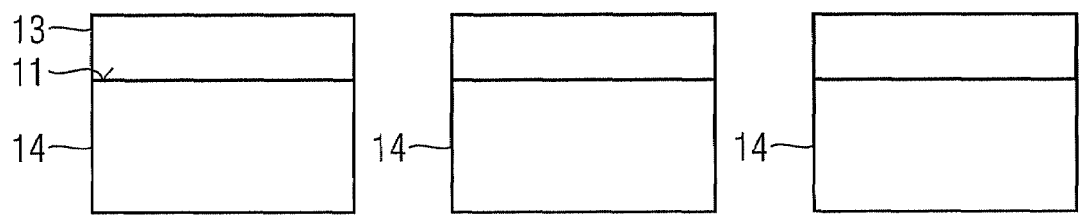
Figure 1D:
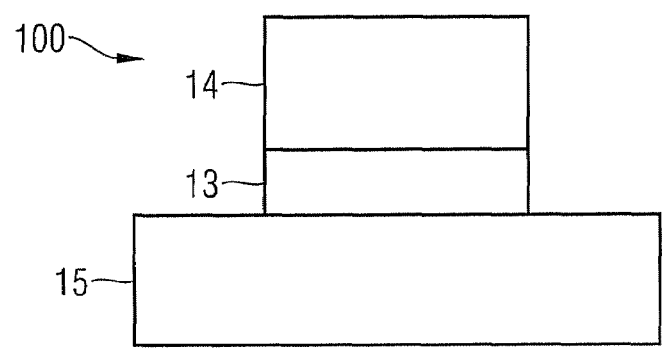

FIGS. 1A to 1D schematically illustrate a method for production of a device 100. A cross section of the device 100 obtained by the method is illustrated in FIG. 1D. Firstly, a semiconductor wafer 10 is provided (see FIG. 1A). The semiconductor wafer 10 has a first surface 11 and a second surface 12 opposite to the first surface 11. A paste including electrically conductive particles 13 is applied to the first surface 11 of the semiconductor wafer 10 (see FIG. 1B). The semiconductor wafer 10 together with the electrically conductive particles 13 is singulated, and a plurality of semiconductor chips 14 is obtained (see FIG. 1C). The first surface 11 of the semiconductor chips 14 is covered with the electrically conductive particles 13. Although only three of the semiconductor chips 14 are illustrated in FIG. 1C, any number of semiconductor chips 14 can be obtained from the semiconductor wafer 10. At least one of the semiconductor chips 14 is placed over a carrier 15 with the electrically conductive particles 13 facing the carrier (see FIG. 1D). The electrically conductive particles 13 are heated until the semiconductor chip 14 adheres to the carrier 15.

When heating the electrically conductive particles 13 they may sinter and may form a solid layer. In this case the device 100 as illustrated in FIG. 1D includes the carrier 15, a sintered layer of an electrically conductive material applied to the carrier 15 and the semiconductor chip 14 applied to the sintered layer.

Figure 2A:
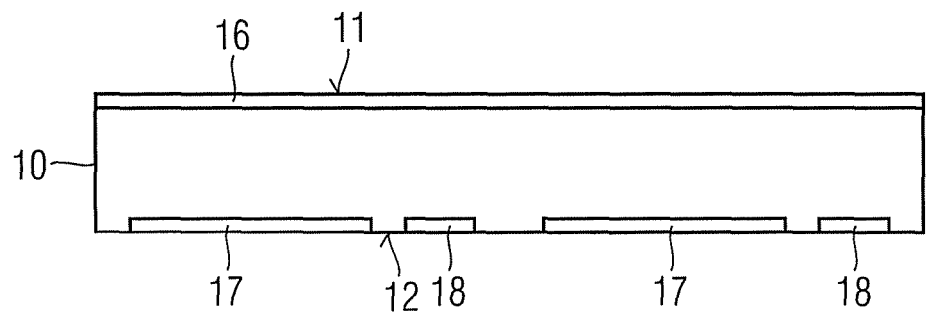
FIGS. 2A to 2I schematically illustrate one embodiment of a method to fabricate a device 200.
Figure 2B:
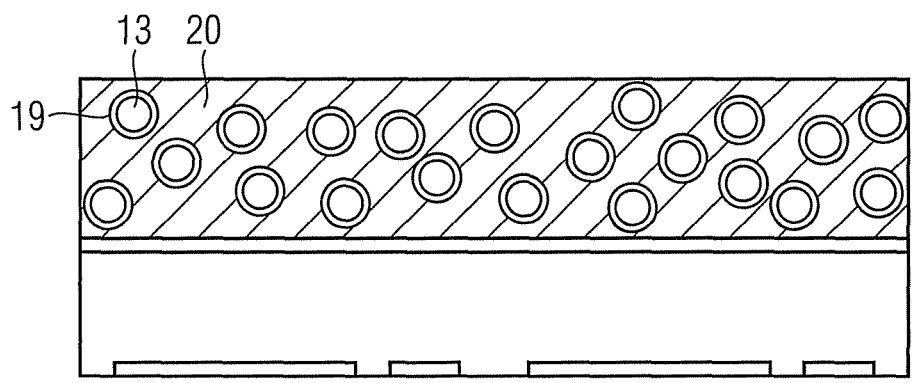
Figure 2C:
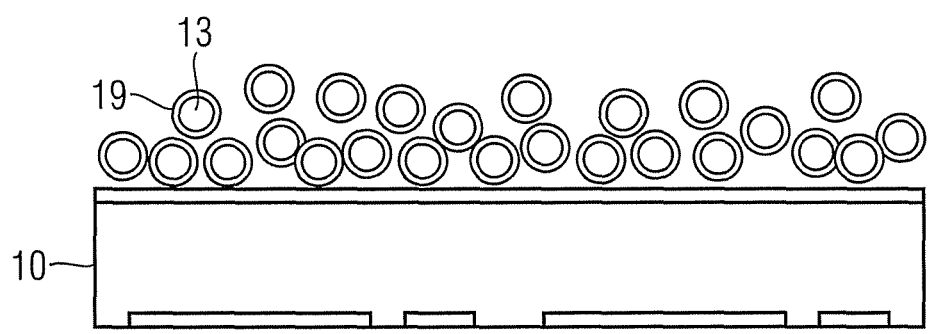
Figure 2D:
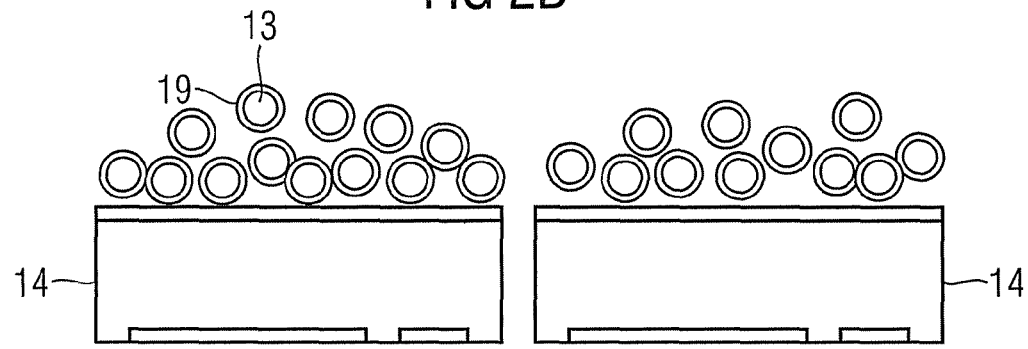
Figure 2E:
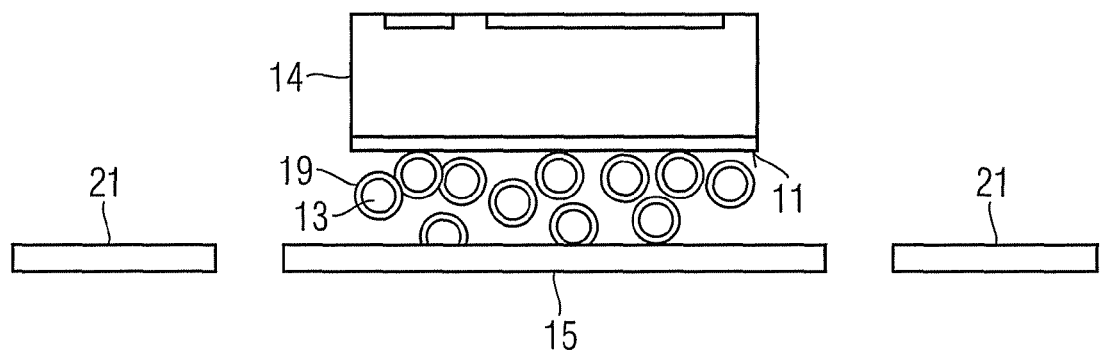
Figure 2F:
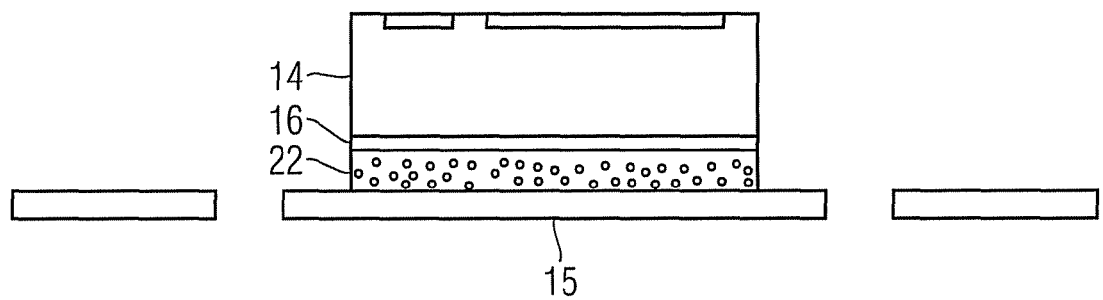
Figure 2G:
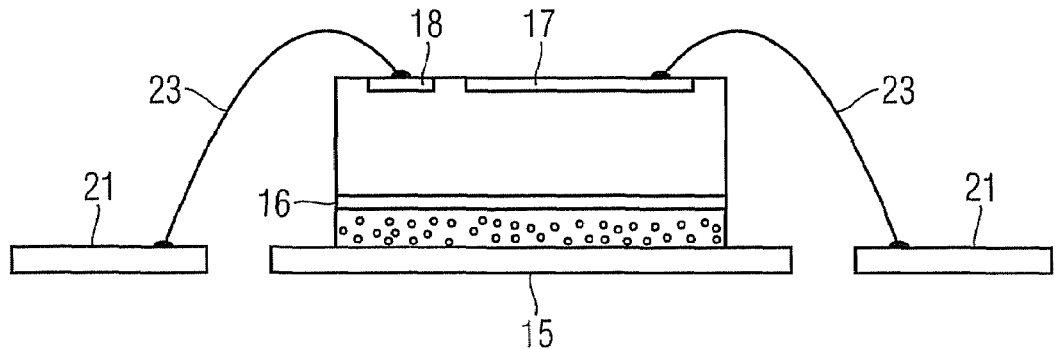
Figure 2H:
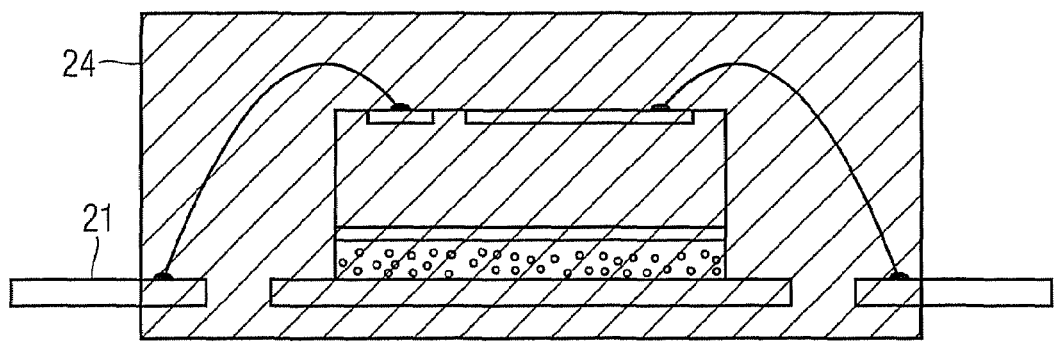
Figure 2I:
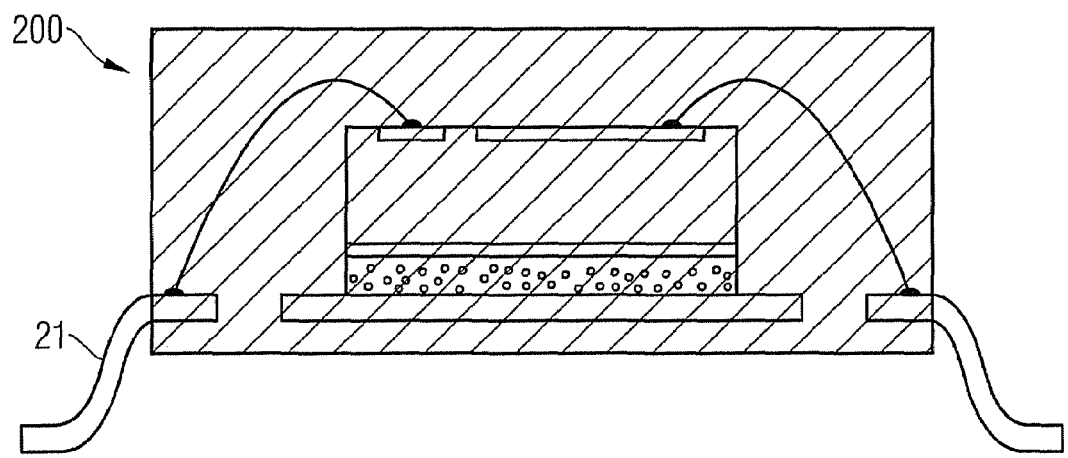

FIGS. 2A to 2I schematically illustrate a method for production of a device 200, a cross section of which is illustrated in FIG. 2I. The method illustrated in FIGS. 2A to 2I may be a development of the method illustrated in FIGS. 1A to 1D. The details of the production method that are described below can therefore be likewise applied to the method of FIGS. 1A to 1D.

The semiconductor chips 14 as well as all other semiconductor chips described herein may be fabricated on a wafer made of semiconductor material. The semiconductor wafer may have any shape and size and may be manufactured from any semiconductor material. Such a semiconductor wafer 10 is illustrated in FIG. 2A. The semiconductor wafer 10 has contact pads 16 on its first surface 11 and contact pads 17 and 18 on its second surface 12. The integrated circuits embedded in the semiconductor wafer 10 can be electrically accessed via the contact pads 16 to 18. The contact pads 16 to 18 may be made of a metal, for example silver, aluminum or copper. In the embodiment illustrated in FIG. 2A the first surface 11 is entirely coated with a metal layer 16. As an alternative, the metal layer 16 may be structured.

The integrated circuits contained in the semiconductor wafer 10 may be physically identical, but may also differ from each other. The integrated circuits may, for example, be vertical power diodes or vertical power transistors, for example IGBTs, JFETs, power bipolar transistors or power MOSFETs. In the latter case, which is exemplarily illustrated in FIG. 2A, the contact pad 16 may be the drain electrode of the power MOSFETs, and the contact pads 17 and 18 may function as the source and gate electrodes of the power MOSFETs, respectively.

Instead of vertical power diodes or vertical power transistors, other integrated circuits, such as logic circuits, may be contained in the semiconductor wafer 10. In one embodiment those circuits may be embedded in the semiconductor wafer 10 which have an electrode or contact pad on their backside.

As illustrated in FIG. 2B a paste containing the electrically conductive particles 13 is applied to the first surface 11 of the semiconductor wafer 10. The electrically conductive particles 13 may, for example, be made of a metal, such as silver, gold, copper, tin or nickel. According to one embodiment, the electrically conductive particles 13 may be made of a pure metal or of a metal alloy. The extensions (average diameter) of the electrically conductive particles 13 may be smaller than 100 nm and, in one embodiment, smaller than 50 nm or 10 nm. It may also be provided that only a fraction of the electrically conductive particles 13, which are applied to the semiconductor wafer 10, has such dimensions. For example, at least 10% or 20% or 30% or 40% or 50% or 60% or 70% of the electrically conductive particles 13 may have dimensions smaller than 100 nm or 50 nm or 10 nm. The other electrically conductive particles 13 may have larger dimensions.

The electrically conductive particles 13 may be coated with a layer 19 of an organic material or a flux material, for example colophony. Furthermore, the electrically conductive particles 13 may be dispersed in a suitable liquid or solvent 20. The paste containing the electrically conductive particles 13 may be fluid, viscous or waxy. Pastes containing electrically conductive particles, which are coated with a layer of an organic or flux material and dispersed in a solvent, can, for example, be purchased from the companies Coocson Electronic (product name: N 1000), Advanced Nano-Particles (ANP), Harima Chemicals (product names: NPS-H and NHD-1) or NBE Technologies (product name: NBE Tech). Other products from these or other companies may be used and may serve the same purpose as described below.

The application of the paste containing the electrically conductive particles 13 dispersed in the solvent 20 may be performed by stencil printing or other printing technologies. Moreover, the paste may be distributed by a squeegee. Other techniques for the application of the paste to the semiconductor wafer 10 are also possible, for example dispensing or spin-coating.

One of the tasks of the solvent 20 may be to enable the electrically conductive particles 13 to be applied to the first surface 11 of the semiconductor wafer 10. Therefore, the solvent 20 may be chosen such that—depending on the application technique—it is fluid, viscous or waxy during the application of the paste.

After the application of the paste, the paste may be exposed to a moderate temperature $T_1$ in an oven, which may be smaller than 150° C. The exposure time may be arbitrary, in one embodiment it may be long enough to allow the solvent 20 to at least partially evaporate leaving the electrically conductive particles 13 localized on the semiconductor wafer 10 as illustrated in FIG. 2C. The solvent 20 may evaporate without any residues. The temperature $T_1$ may be chosen such that the layers 19 coating the electrically conductive particles 13 do not melt, in one embodiment if the diameter of the electrically conductive particles 13 is smaller than 50 nm or 10 nm. According to an alternative embodiment, the layers 19 may at least partially melt or evaporate at the temperature $T_1$.

The layers 19 coating the electrically conductive particles 13 may prevent premature agglomeration of the electrically conductive particles 13.

After the evaporation of the solvent 20, the semiconductor wafer 10 may be diced thereby separating the individual semiconductor chips 14 as illustrated in FIG. 2D. Singulating the semiconductor wafer 10 may be carried out by sawing or any other appropriate technique, for example laser ablation, cutting, stamping, milling or etching. Although only two of the semiconductor chips 14 are illustrated in FIG. 2D, any number of semiconductor chips 14 can be obtained from the semiconductor wafer 10.

The layers 19 of organic material or flux material coating the electrically conductive particles 13 may ensure that the electrically conductive particles 13 adhere sufficiently well to the first surface 11 of the semiconductor wafer 10 and to each other so that at least a sufficient fraction of the electrically conductive particles 13 remain on the first surface 11 even after the dicing of the semiconductor wafer 10.

As illustrated in FIG. 2E, at least one of the semiconductor chips 14 may be placed over the carrier 15 with the first surface 11 and the electrically conductive particles 13 facing the carrier 15. The carrier 15 may, for example, be a part of a leadframe, such as a die pad. The leadframe may further include leads 21 and other die pads. The leadframe may be manufactured from a metal or metal alloy, in one embodiment copper, a copper alloy, iron nickel, aluminum, or other electrically conductive materials. Furthermore, the leadframe may be plated with an electrically conductive material, for example copper, silver, iron nickel or nickel phosphorus. The shape of the leadframe is not limited to any size or geometric shape. The leadframe may have been manufactured by punching a metal plate. The die pads and leads of the leadframe may be connected to each other by dams.

In FIG. 2E only one semiconductor chip 14 is illustrated placed over the leadframe. Further semiconductor chips may also be placed over the leadframe. These semiconductor chips may have been fabricated on the same semiconductor wafer, but may have been manufactured on different semiconductor wafers. Furthermore, the semiconductor chips may be physically identical, but may also contain different integrated circuits.

The electrically conductive particles 13 may be exposed to a temperature $T_2$, which is high enough that the layers 19 coating the electrically conductive particles 13 sublimate or evaporate. Furthermore, the temperature $T_2$ may be lower than the melting temperature of the metal of which the electrically conductive particles 13 are made. After the layers 19 are removed, the electrically conductive particles 13 may form a solid layer 22 by sintering due to the temperature $T_2$. The temperature $T_2$ may be in the range from 150 to 450° C., in one embodiment in the range from 180 to 300° C. and may depend on the material of the electrically conductive particles 13.

For producing the sintered joint, the carrier 15 may be heated by a hot plate to the temperature $T_2$. In one embodiment, both the carrier 15 and the semiconductor chip 14 may be placed in an oven and heated to an appropriate temperature. A pick-and-place tool may be used capable of picking the semiconductor chip 14 and placing it on the heated carrier 15. During the sintering process the semiconductor chip 14 may be pressed onto the carrier 15 for an appropriate time.

The layers 19 coating the electrically conductive particles 13 before the sintering process may prevent oxidation of the electrically conductive particles 13. If an outer layer of the electrically conductive particles 13 is oxidized, a higher temperature $T_2$ would be required to sinter the electrically conductive particles 13. Furthermore, the sinter temperature $T_2$ may be reduced by reducing the diameters or dimensions of the electrically conductive particles 13. Due to the different thermal expansion coefficients of the semiconductor chip 14 and the carrier 15 a low temperature $T_2$ is desired to reduce the mechanical stress induced into the semiconductor chip 14 by the carrier 15 during the sintering process. As an example, copper of which the carrier 15 may be manufactured has a thermal expansion coefficient of about $17 \times 10^{-6}$/K and silicon has a thermal expansion coefficient of about $3 \times 10^{-6}$/K.

As illustrated in FIG. 2F, sintered layer 22 fastens the semiconductor chip 14 to the carrier 15 and electrically couples the contact pad 16 to the electrically conductive carrier 15. The sintered layer 22 may be of any thickness, in one embodiment its thickness may be in the range from 1 to 30 μm. Pores may be distributed over the sintered layer 22.

After the attachment of the semiconductor chip 14 to the carrier 15, electrical interconnections may be established from the contact pads 17 and 18 of the semiconductor chip 14 to the leads 21. As illustrated in FIG. 2G, these interconnections may be made by wire bonding. For example, ball bonding or wedge bonding may be used as the interconnect technique. The bond wires 23 may be made up of gold, aluminum, copper or any other appropriate electrically conductive material. One or more bond wires 23 may be attached to electrically couple each of the contact pads 17 and 18 to the leads 21. The carrier 15 may be connected to another lead 21 which is not illustrated in FIG. 2G. This lead 21 and the carrier 15 may be made of one piece.

As alternatives to wire bonding, other interconnect techniques may be used. For example, metallic clips may be placed on the semiconductor chip 14 and the leads 21 in order to establish the electrical connections.

A mold transfer process may be carried out to encapsulate the components arranged on the leadframe with a mold material 24 as illustrated in FIG. 2H. The mold material 24 may encapsulate any portion of the device 200, but leaves at least parts of the leads 21 uncovered. The exposed parts of the leads 21 may be used as external contact elements to electrically couple the device 200 to other components, for example a circuit board, such as a PCB (Printed Circuit Board).

The mold material 24 may be composed of any appropriate electrically insulating thermoplastic or thermosetting material, in one embodiment it may be composed of a material commonly used in contemporary semiconductor packaging technology. Various techniques may be employed to cover the components of the device 200 with the mold material 24, for example compression molding, injection molding, powder molding or liquid molding.

Before or after the encapsulation with the mold material 24, the individual devices 200 are separated from one another by separation of the leadframe, for example by sawing the dams. Afterwards, the leads 21 may be bent and/or trimmed as illustrated in FIG. 2I in order to mount the device 200 on a circuit board. Instead of having the leads 21 protruding from the mold material 24, it is also possible to have a leadless device 200.

It is obvious to a person skilled in the art that the devices 100 and 200 illustrated in FIGS. 1D and 2I are only intended to be exemplary embodiments, and many variations are possible. For example, it is possible to use electrically conductive particles 13 which have dimensions higher than 100 nm, for example in the range from 1 to 3 μm. These electrically conductive particles 13 may, for example, be made of AuSn or other metal alloys. They may also be coated by a layer 19 made of an organic or flux material and may be dispersed in a solvent 20. However, rather than being sintered these electrically conductive particles 13 may be melted when attached to the carrier 15. The temperature $T_2$ may be in the range from 300 to 400° C. and depends on the material of the electrically conductive particles 13.

Another variation of the method illustrated in FIGS. 2A to 2I is to stack two or more semiconductor chips on top of each other and using the method described above for attaching the semiconductor chips.

Figure 3A:
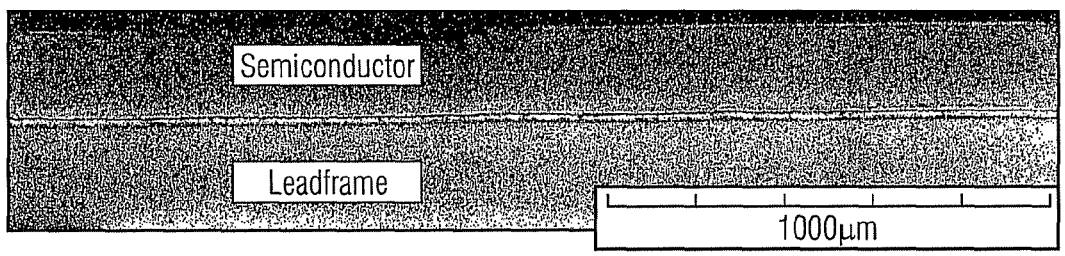
FIGS. 3A and 3B illustrate microscopic images of a semiconductor chip mounted on a leadframe.
Figure 3B:
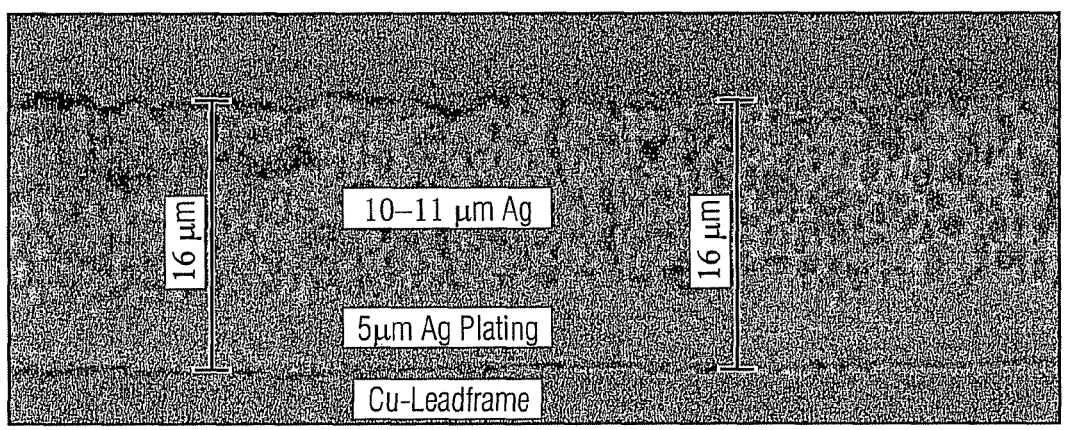

In FIGS. 3A and 3B microscopic images are illustrated of a cross section of a semiconductor chip mounted on a leadframe by using the method illustrated in FIGS. 2A to 2F. In the present example a paste containing silver particles was applied to a semiconductor wafer. The paste was dried at a temperature $T_1$ of 95° C. for 10 minutes. A layer of silver particles having a layer thickness of about 15 µm was obtained. After dicing the semiconductor wafer, one of the semiconductor chips was mounted on a leadframe coated with a 5 µm layer of silver at a temperature $T_2$ of 300° C. for 6 seconds.

As can be seen from FIG. 3B the silver layer attaching the semiconductor chip to the leadframe has a thickness of 10 to 11 µm and a spongy structure which is due to the sintering process.

Figure 4:
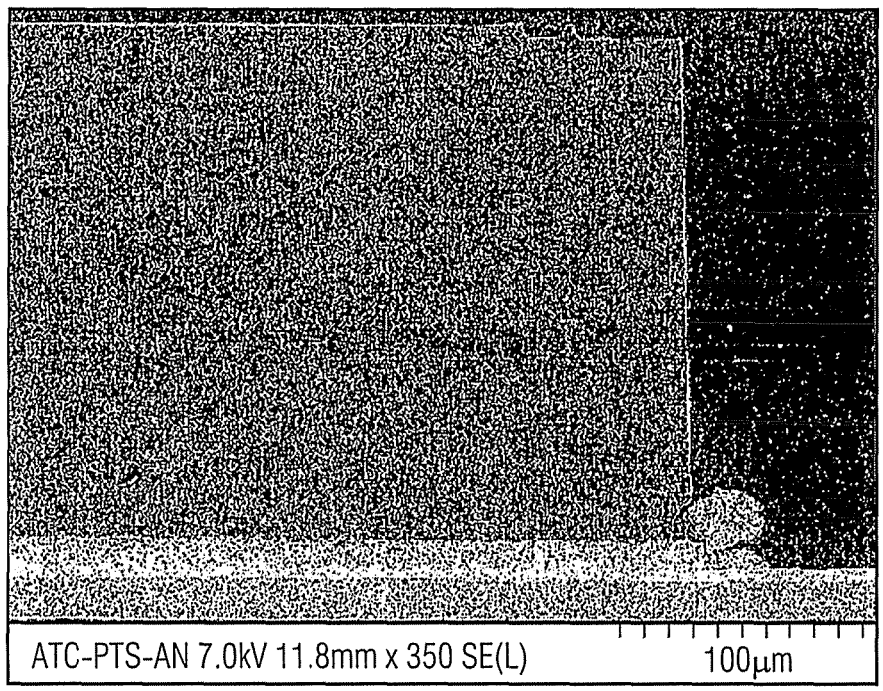
FIG. 4 illustrates an electron microscopic image of a semiconductor chip mounted on a leadframe.

FIG. 4 illustrates an electron microscopic image of a further cross section of a semiconductor chip mounted on a leadframe by using the method described above. It is obvious from FIG. 4 that only little electrically conductive material is squeezed out when the semiconductor chip is mounted on the leadframe. Furthermore, the sintered layer has a very uniform thickness and contains only a few voids.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    applying electrically conductive particles to a surface of a semiconductor wafer;
    singulating the semiconductor wafer with the electrically conductive particles for obtaining a plurality of semiconductor chips;
    placing at least one of the plurality of semiconductor chips over a carrier with the electrically conductive particles facing the carrier; and
    sintering the electrically conductive particles at a temperature that is lower than the melting temperature of a material the electrically conductive particles are made of until the at least one semiconductor chip adheres to the carrier.

2. The method of claim 1, comprising dispersing the electrically conductive particles in a liquid when applied to the semiconductor wafer.

3. The method of claim 2, comprising applying heat to the semiconductor wafer until the liquid is at least partially evaporated before singulating the semiconductor wafer.

4. The method of claim 1, comprising applying heat and/or pressure to the electrically conductive particles when sintering the electrically conductive particles.

5. The method of claim 1, comprising coating the electrically conductive particles with an organic material or a flux material.

6. The method of claim 5, comprising removing the organic material or the flux material when the electrically conductive particles are sintered.

7. A method, comprising:
    applying a paste comprising electrically conductive particles to a surface of a semiconductor wafer, wherein at least a 50% of the electrically conductive particles have a diameter of less than 100 nm;
    singulating the semiconductor wafer with the electrically conductive particles for obtaining a plurality of semiconductor chips;
    placing at least one of the plurality of semiconductor chips over a carrier with the electrically conductive particles facing the carrier;
    heating the electrically conductive particles to a temperature that is lower than the melting temperature of a material the electrically conductive particles are made of unit the at least one semiconductor chip adheres to the carrier and wherein, after heating, the electrically conductive particles electrically couple that at least one semiconductor chip to the carrier; and
    wherein heating the electrically conductive particles sinters the electrically conductive particles.

* * * * *